United States Patent [19]

Wotherspoon

[11] Patent Number: 4,859,851
[45] Date of Patent: Aug. 22, 1989

[54] THERMAL-RADIATION IMAGING DEVICES AND SYSTEMS, AND THE MANUFACTURE OF SUCH IMAGING DEVICES

[75] Inventor: John T. M. Wotherspoon, Southampton, United Kingdom

[73] Assignee: Philips Electronics and Associated Industries Limited, London, England

[21] Appl. No.: 512,440

[22] Filed: Jul. 1, 1983

[30] Foreign Application Priority Data

Jul. 27, 1982 [GB] United Kingdom ............... 8224643

[51] Int. Cl.⁴ .................... G02B 26/10; H01L 27/14
[52] U.S. Cl. ................................. 250/334; 250/332; 250/370.08; 357/30; 357/24
[58] Field of Search ............... 250/211 J, 578, 342, 250/330, 338 R, 338 SE, 334, 370.08, 332; 358/212; 357/24 LR, 30

[56]  References Cited

U.S. PATENT DOCUMENTS

| | | | |
|---|---|---|---|
| 3,704,376 | 11/1972 | Lehovac et al. | 250/211 J |
| 3,983,573 | 9/1976 | Ishihara | 250/578 |
| 3,995,159 | 11/1976 | Elliott | 250/334 |
| 4,000,502 | 12/1976 | Butler et al. | 250/338 SE |
| 4,162,402 | 7/1979 | Hopper | 250/332 |
| 4,288,702 | 9/1981 | Ozawa et al. | 250/578 |
| 4,507,674 | 3/1985 | Gaalema | 357/30 |
| 4,521,798 | 6/1985 | Baker | 357/24 LR |

Primary Examiner—Stephen C. Buczinski
Attorney, Agent, or Firm—Cushman, Darby & Cushman

[57]  ABSTRACT

A thermal-radiation imaging device comprises at least one semconductor body portion (10,20,30,40), e.g. of n-type cadmium mercury telluride, on which biasing-electrode means (1 to 4 and 4b to 44b), e.g. of gold, are spaced for causing a bias current predominantly of majority charge-carriers to flow along each strip (10,20,30,40). The bias current supports an ambipolar drift of radiation-generated charge carriers in the opposite direction. One or more read-out means (e.g. 11,21,51,41) is present in the drift path of each body portion (e.g. 10). The body portion (10,20,30,40) is present on a substrate 100 having a conductor pattern (61 to 64, 71 to 74, 81 to 84, 91 to 94) which provides electrical connections to each of the read-out means. Each read-out means which may be a diode junction or an electrode pair is formed at holes (reference a and b for an electrode pair) which extend through the thickness of the body portion (10,20,30,40) to the conductor pattern of the substrate (100). These holes can be formed with small transverse dimensions by ion-etching Metallization (7) which forms a connection to the substrate conductor pattern (61 to 64, 71 to 74, 81 to 84, 91 to 94) is deposited over substantially the whole side wall of each hole without extending on the upper major surface of the body portion (10,20,30,40). In this manner precise and reliable connections can be provided for the read-out means in a compact device structure without significantly interfering with the ambipolar drift of the minority carriers.

20 Claims, 3 Drawing Sheets

THERMAL-RADIATION IMAGING DEVICES AND SYSTEMS, AND THE MANUFACTURE OF SUCH IMAGING DEVICES

This invention relates to thermal-radiation imaging devices comprising a semiconductor body (particularly, but not exclusively, of cadmium mercury telluride) and involving an ambipolar drift of radiation-generated free minority charge carriers. The invention further relates to thermal-radiation imaging systems comprising such a device and to methods of manufacturing such a device.

U.K. Patent Specification GB-A 1,488,258 discloses a thermal-radiation imaging device comprising a semiconductor body portion of one conductivity type in which free change carries can be generated on absorption of thermal radiation. Biasing electrode means are spaced on the body portion for causing a bias current predominantly of majority charge carries to flow in the body portion in one direction and parallel to a major surface of the body portion. This bias current is capable of supporting an ambipolar drift of radiation-generated free minority charge carriers in the opposite direction to said flow of majority carriers. Read-out means are present in the ambipolar drift path.

The material of the semiconductor body portion is usually cadmium mercury telluride. The read-out means may comprise a pair of first and second read-out electrodes, in close proximity and forming ohmic connections to the body portion; these electrodes may be of a metal such as aluminium. The picture signal is derived as a voltage between the two read-out electrodes which as a result of conductivity modulation is a measure of the density of minority carriers which are generated by the radiation and drift to the read-out means. In another form the read-out means may be either metal or a semiconductor region which forms a diode junction with the body portion of the one conductivity type, and this junction is reverse-biased in use by applying a suitable bias voltage. The current generated via this diode is also a measure of the density of minority carriers generated by the radiation. The diode junction may also be used in a non-biased condition.

The device forms part of a thermal-radiation imaging system in which a thermal radiation image is scanned along the device body portion in the same direction as the ambipolar drift and at a rate corresponding substantially to the ambipolar drift velocity so that integration of the minority carriers generated by each element of the radiation image occurs along the length of the drift path before the read-out means.

In the particular imaging device which are described and shown in GB-A 1,488,258, the read-out means are provided only at an end of the semiconductor body portion, and the semiconductor body is in the form of an elongate strip which comprises only a single imaging device element. When the read-out means is a pair of electrodes, the second electrode of the pair is generally formed by the biasing electrode. However, as described in co-pending U.S. Pat. application Ser. No. 267611 (Our reference: PHB 31616) now Pat. No. 4,801,802 and Ser. No. 153923 (Our reference: PHB 32660), similar imaging devices are also desirable in which a plurality of read-out means is present in the ambipolar drift path at different locations between the spaced biasing electrode means. These read-out means may be arranged sequentially along a semiconductor strip to form a plurality of device elements which are used sequentially. A parallel arrangement of such multi-element strips of cadmium mercury telluride may also be formed on a common substrate, or parallel drift paths may be formed in a common body of cadmium mercury telluride. In another arrangement the read-out means are distributed in directions transverse to the ambipolar drift path or paths. It should be noted that the co-pending U.S. Pat. application Nos. 153923 and 267611 have not been published before the priority date of the present application.

In the particular forms of the imaging devices described and shown in GB-A 1,488,258, the metal or semiconductor regions forming the read-out means are present on the upper major surface of the strip and generally extend across the whole width of the strip at said upper major surface. However, the Applicants have found that such a read-out configuration can interfere with and disturb the ambipolar drift of the radiation-generated free minority carriers by increasing recombination of the carriers so that part of the signal is lost. This becomes particularly important for devices having a plurality of read-out means in the drift path. The strip itself is mounted in a conventional encapsulation arrangement for cooling the strip to the desired operating temperature and for providing the appropriate electrical connections. It is conventional practice to use wire bonds to provide the electrical connections to a thermal-radiation imaging device in such an encapsulation. However the bonding of a wire connection directly to such a read-out means on the upper major surface of the semiconductor strip can introduce damage into the semiconductor material, causing significant recombination of the charge carriers in this sensitive area of the ambipolar drift path.

The Applicants have also assembled a plurality of such device strips in parallel on a common substrate, as described in said co-pending unpublished U.S. Pat. application No. 153923. In order to reduce the non-sensitive area (the so-called "dead-space") between the parallel strips it is desirable for the strips to be closely spaced together. In order to simplify the imaging system using such parallel strips it is also usually desirable for the read-out means and biasing electrode means to be respectively substantially aligned in directions substantially perpendicular to the strips. This double desire for close spacing and alignment can be met (even with multi-element strips) by wire-bonding directly to the read-out means on the upper major surface of each strip, but this suffers from the disadvantages described hereinbefore. Furthermore care must be taken to ensure that individual connections are not shorted to one another or to adjacent device-strip areas and that the connection provided for one read-out means does not obscure and undesirably mask from the radiation other parts of the drift path or the drift paths of other device elements.

According to one aspect of the present invention there is provided a thermal-radiation imaging device comprising a semiconductor body portion of one conductivity type in which free charge carriers can be generated on absorption of thermal radiation, biasing electrode means spaced on the body portion for causing a bias current predominantly of majority charge carriers to flow in the body portion in one direction and parallel to a major surface of the body portion, said bias current being capable of supporting an ambipolar drift of radiation-generated free minority charge carries in the opposite direction to said flow of majority carriers, and read-out means in the ambipolar drift path, characterized in that said semiconductor body portion is present on a substrate having a conductor pattern which provides an electrical connection for said read-out means, in that at the area of said read-out means at least one hole is present in the body portion and extends through the thickness of the body portion to the conductor pattern of the substrate, and in that metallization which forms an electrical connection to the conductor pattern at the hole extends over substantially the whole side wall of the hole without extending on the upper major surface of the semiconductor body portion.

A particularly compact connection structure for the read-out means as well as advantageous device characteristics can be obtained in this manner in accordance with the invention. The read-out means is orientated across the thickness of the body portion and not across its upper major surface. The metallized hole or holes of the read-out means do no involve metallization on the upper major surface of the semiconductor body portion and need not interrupt the ambipolar drift path to any great extent nor significantly interfere with the ambipolar drift of the minority carriers. However such metallized holes can provide reliable individual connections to the substrate conductor pattern even in very small areas, and by means of the substrate conductor pattern the connections to the read-out means can be carried below the semiconductor body portion or portions and hence in a non-obscuring manner. This is especially advantageous for obtaining compact device structure having a substantially parallel plurality of closely-spaced body portions with little "dead-space". In particular it permits the read-out means of the different body portions to be substantially aligned in a direction substantially perpendicular to the ambipolar drift paths, even when a plurality of said read-out means is present in the ambipolar drift path at different locations between the spaced biasing electrode means. The disadvantages of wire-bonding directly to read-out means on the upper surface of the body portion are avoided.

Although such metallized hole connections may be used with p-n junction diode read-out means, a particularly simple structure results when the metallized holes themselves constitute the read-out means. In this latter case, the metallization may form a Schottky diode with the side-wall of the hole, or the read-out means may comprise a pair of the holes which are spaced along the ambipolar drift path and at the side-walls of which the metallization forms an electrode connection to the body portion of said one conductivity type.

As will be described later, the holes can be formed with very small transverse dimensions (for example less than 15 micrometers) by ion-etching with a masking technique, and this is particularly advantageous when a pair of such holes forming electrode connections are used for the read-out means. In order to reduce the extent to which the metallized holes interrupt the ambipolar drift path it is preferable for the largest transverse dimension of each of said holes to be less than a third of the width of the ambipolar drift path before the area of the read-out means. Since the width of any particular ambipolar drift path may often be about 50 micrometers or more, the largest transverse dimension of the holes can often be less than a quarter and even less than a fifth of said width of the ambipolar drift path. This provides a choice in the precise location across the width of the drift path where the read-out holes are provided. Thus, the metallized holes may be located at the centre of the drift path or at areas which are nearer one side periphery of the body portion, for example at areas which are spaced from the periphery by a third of the width of the drift path. However, in another form the holes extend through the thickness of the body portion at areas along the periphery of the body portion.

As is already described in said co-pending unpublished U.S. Pat. application Ser. No. 153923, it is advantageous to narrow the ambipolar drift path at the area of the read-out means because the narrowing results in a constriction of the bias current in this area and so introduces a higher electric field which improves the device characteristics by increasing both the drift velocity and the responsivity of the device. When the metallized read-out holes are spaced from the periphery of the body portion, a recess may be present in the periphery at this area in order to obtain the advantageous narrowing of the drift path. When the metallized read-out holes are present along the periphery of the body portion, these read-out means are preferably present at the area of such a recess in the periphery. However, narrowing of the drift path of the area of the metallized read-out holes can result in these holes having a more prominent effect on the drift path, and so in order to reduce this effect while still using a recess it is particularly advantageous to provide the metallized read-out holes at the ends of strip-shaped parts of the body portion which extend into the recess from the ambipolar drift path.

According to another aspect of the present invention, there is provided a method of manufacturing an imaging device in accordance with the invention, characterized by the steps of providing at least one semiconductor body portion on the substrate having a conductor pattern for forming the electrical connection for the read-out means, providing on the semiconductor body portion and on the substrate a masking layer having at least one window where said at least one hole is to be formed in the body portion, ion-etching through the thickness of the body portion at said at least one window to form said at least one hole, depositing metallization on said masking layer and in said at least one window of the masking layer, and removing said masking layer from said body portion to lift away the overlying metallization while leaving the metallization in said at least one hole so as to form the electrical connection from the side-wall of the hole to the conductor pattern of the substrate.

The same masking layer may have additional windows for etching and metallizing the ends of the semiconductor body portion or portions to form the biasing electrode means.

According to a further aspect of the present invention there is provided a thermal-radiation imaging system comprising an imaging device in accordance with the invention, further characterized by means for scanning a thermal radiation image along said body portion in the same direction as the ambipolar drift and at a rate corresponding substantially to the ambipolar drift velocity. Thus, imaging devices in accordance with the invention may be used in systems involving mechanical scanning means similar to those described in GB-A 1,488,258 and said co-pending unpublished U.K. applications.

However, devices in accordance with the present invention may be used in thermal-radiation imaging systems using other forms of scanning, for example a system comprising means for applying a scanning voltage gradient to the semiconductor body portion via the biasing-electrode means so as to drive the radiation-generated carriers towards the read-out means.

Embodiments of the various aspects of the invention will now be described by way of example with reference to the accompanying diagrammatic drawings which also illustrate yet further advantageous features which can be obtained in accordance with the invention. In these drawings.

Figure 1:
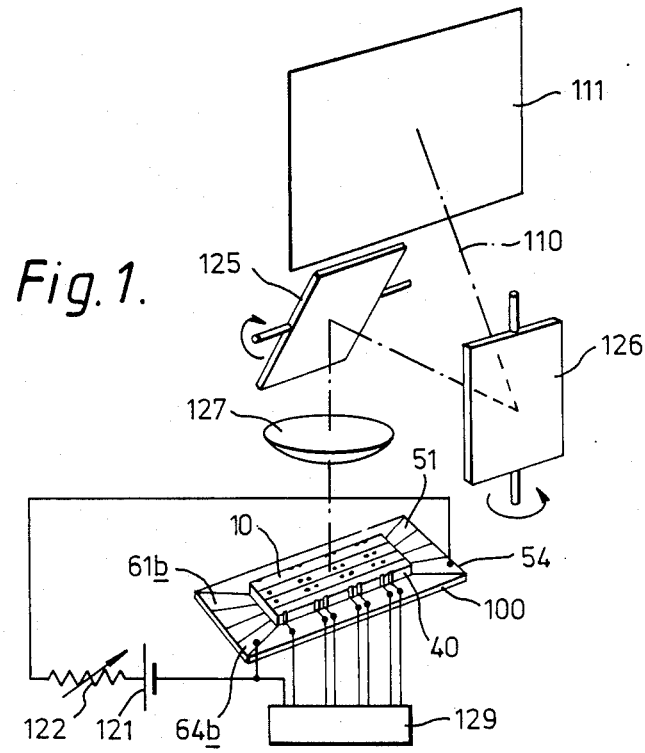
FIG. 1 is a perspective view, in simplified form, of a thermal-radiation imaging system in accordance with the invention.

It should be noted that the Figures are not drawn to scale, and the relative dimensions and proportions of some parts have been exaggerated or reduced for the sake of clarity and convenience in the drawings. The same reference numerals are used in the various Figures to indicate not only the same portions of the same embodiment but also similar portions of similar but different embodiments.

The thermal-radiation imaging device in FIGS. 1 to 4 comprises a plurality of semiconductor body portions 10,20,30 and 40 of one conductivity type in which free charge carriers can be generated on absorption of thermal radiation 110 from a scene 111. These body portions are in the form of parallel elongate strips of semiconductor material secured to a substrate 100. In a typical example, the semiconductor material may be n-type cadmium mercury telluride $Hg_{0.79}Cd_{0.21}Te$ having a carrier concentration of less than $5 \times 10^{14} cm.^{-3}$ at a temperature 77° K. and in the absence of incident radiation 110. In material of this composition the radiation absorption edge at an operating temperature of 77° K. is at a wavelength of about 12 micrometers. In this material the absorption of infra-red radiation in the 8 to 14 micrometer atmospheric window is effective in generating electron-hole pairs, the mobility of the holes at the operating temperature of 77° K. may be about 600 cm.$^2$V$^{-1}$sec.$^{-1}$ and their lifetime may be about 2.5 microseconds. The electron mobility may be about $2 \times 10^5 cm.^2 V^{-1} sec.^{-1}$.

Figure 2:
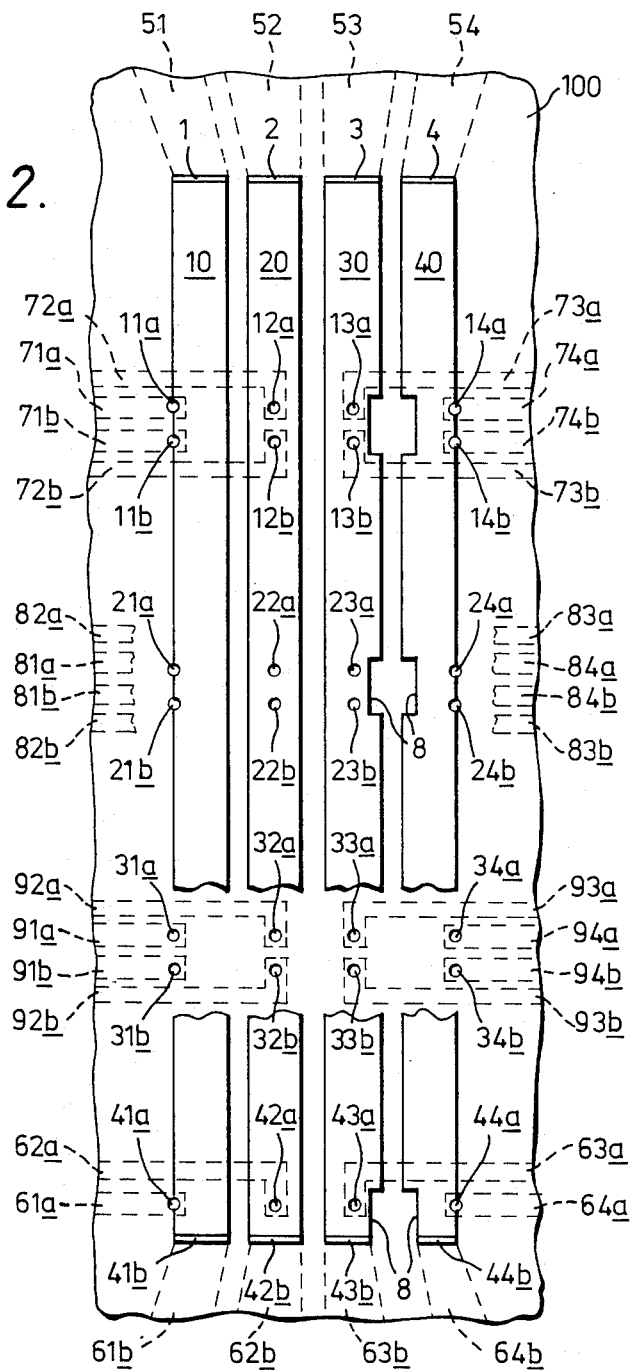
FIG. 2 is a plan view (partly broken-away) of a thermal-radiation imaging device in accordance with the invention and suitable for the system of FIG. 1.

Each strip 10,20,30,40 may have a width of, for example, 62.5 micrometers and a thickness of 10 micrometers. The strips 10,20 30,40 may be separated by slots having a width of for example 12.5 micrometers. FIGS. 1 and 2 show by way of example four such separated strips 10,20,30,40. The length of the strips 10,20,30,40 depends on the number and spacing of read-out means along each strip. FIGS. 1 and 2 illustrate four read-out means along each strip, and in this case the length of each strip 10,20,30,40 may be, for example, about 2 or 3 mm. depending on the spacing. It will be evident that different systems may require a different number of strips 10,20,30,40 and different dimensions for their length, width, thickness and spacing.

Metal layers 1 to 4 and 41b to 44b form ohmic contacts to the opposite ends of the strips 10,20,30,40 to provide spaced biasing electrode means on each strip. By means of these spaced electrodes 1 and 41b, 2 and 42b, 3 and 43b, and 4 and 44b (and their connections 51 to 54 and 61b to 64b on the substrate 100), each strip 10,20,30,40 is connected in series with a D.C. voltage source 121 and a variable resistor 122 to cause a constant bias current predominantly of majority charge carriers (electrons, in this example) to flow in the respective strip in the longitudinal direction from the electrodes 41b to 44b to the electrodes 1 to 4. For the sake of clarity of drawing, the individual bias sources 121 connected to the strips 10,20 and 30 are not shown in FIG. 1 which only illustrates the bias source 21 connected to the strip 40.

This bias current is capable of supporting an ambipolar drift of radiation-generated free minority charge carriers (holes, in this example) in the opposite direction to the flow of majority carriers, i.e. from electrode 4 to electrode 44b of strip 40. At a potential drop of for example about 15 or 30 volts cm.$^{-1}$ in n-type cadmium mercury telluride material of the previously stated composition the ambipolar mobility may be about 400 cm.$^2$V$^{-1}$sec.$^{-1}$. The precise bias voltage applied between the spaced biasing electrodes is chosen such that the ambipolar drift velocity corresponds to the velocity with which the incident radiation image 110 is scanned along the strips 10,20,30,40.

During operation the device is maintained at a cryogenic temperature and so is further mounted in accordance with the specific intended application. Such further mounting is not illustrated in the accompanying drawings but will normally consist of mounting the substrate 100 in an evacuated enclosure having a device window for transmission of the infra-red radiation 110 (for example in the 8 to 14 micrometer waveband) from a lens system 127, the enclosure being provided with cooling means for maintaining the substrate 100 and its strips 10,20,30 and 40 at the required operating temperature (for example 77° K.). One such form of mounting consists of Dewar-type encapsulations as commonly employed in the infra-red detector art.

The scanning of an infra-red radiation pattern and the focussing of an image of an elemental area of that pattern on the strips 10,20,30,40 may be effected in a similar manner to that described in GB-A 1,488,258. Such means for scanning a thermal radiation image along the strips 10,20,30 and 40 in the same direction as the ambipolar drift and at a rate corresponding substantially to the ambipolar drift velocity are illustrated in a simplified diagrammatic manner in FIG. 1. They may comprise a pair of rotatable mirrors 125 and 126 and a lens system 127. By these means, image areas of a radiation pattern from a scene 111 can be moved with a velocity in the range of 5,000 cm.sec.$^{-1}$ to 50,000 cm.sec.$^{-1}$ along one or more of the semiconductor strips 10,20,30 and 40 which are situated in the focal plane of the imaging assembly.

Since the image is scanned along the strips 10,20,30,40 at a rate corresponding to the ambipolar drift velocity, integration of the radiation-generated minority carriers occurs as these minority carriers drift along the part of the n-type strip where the radiation 110 is incident. The length of the ambipolar drift path over which maximum integration of the radiation-generated minority carriers can be effected is limited to a distance (L) determined by the lifetime ($\tau$) of minority carriers in the semiconductor material, the electric-field (E), and the ambipolar mobility ($\mu$a) which pertains to the semiconductor material and which usually approximates to the minority carrier mobility, such that L=$\tau$.E.$\mu$a. This has to be taken into account in the positioning of the read-out means along the strips 10,20,30,40.

A plurality of read-out means (of which four are shown by way of example in FIGS. 1 and 2) is present in the ambipolar drift path of each strip 10,20,30,40, namely: read-out means 11,21,31 and 41 provided sequentially along the strip 10; read-out means 12,22,32 and 42 provided sequentially along the strip 20; read-out means 13,23,33 and 43 provided sequentially along the strip 30; and read-out means 14,24,34 and 44 provided sequentially along the strip 40. The substrate 100 has a conductor pattern 61 to 64, 71 to 74, 81 to 84, and 91 to 94, which provides electrical connections to each of these read-out means 41 to 44, 11 to 14, 21 to 24, and 31 to 34 respectively. These read-out means are formed at metallized holes 41a to 44a, to 11a to 14a, 11b to 14b, 21a to 24a, 21b to 24b, 31a to 34a, and 31b to 34b in the strips 10,20,30,40, which holes extend through the thickness of the strips 10,20,30,40 to the conductor pattern 61 to 64, 71 to 74, 81 to 84, and 91 to 94 of the substrate 100. As illustrated in the enlarged views of FIGS. 3 and 4, metallization 7 which forms an electrical connection to the substrate conductor pattern at each of these holes extends over substantially the whole side-wall of each of those holes without extending on the upper major surface of the strips 10,20,30,40. In a typical example, the holes may be approximately circular with a diamter of about 10 micrometers and may be formed by ion-etching.

In the form illustrated in FIG. 2, each of the read-out means 11 to 14, 21 to 24, and 31 to 34 comprise a pair of the metallized holes (to which the designation a and b is added) which are spaced in the direction of ambipolar drift and at the side-walls of which the metallization 7 forms an ohmic electrode connection to the n-type material of the strip 10,20,30,40. Each of the read-out means 41 to 44 is provided at one end of the strip 10,20,30,40 and comprises a pair of ohmic electrodes the first of which is formed by the metallization 7 in a hole 41a, 42a, 43a, 44a and the second of which is formed by the bias electrode 41b, 42b, 43b, 44b. The spacing of the read-out electrodes in each pair forming the read-out means 11 to 14, 21 to 24, 31 to 34, or 41 to 44 may be for example 50 to 60 micrometers and is determined in accordance with the desired resolution of the imaging device. When the integrated radiation-generated minority carriers drift through a read-out area between its pair of electrodes, conductivity modulation occurs in the part (at the area 11 to 14, 21 to 24, 31 to 34, or 41 to 44) of the strip 10,20,30,40 between this pair of electrodes. The voltage change occurring at this read-out area as a result of the conductivity modulation is amplified and processed by an output circuit 129 to provide a picture signal. For the sake of clarity in the drawings, only the output circuit 129 for the strip 40 is represented in FIG. 1, whereas in practice separate output circuits 129 are provided for each of the strips 10,20,30 and 40 and are connected to the read-out electrode pairs of their respective strip via the substrate conductor pattern 61 to 64, 71 to 74, 81 to 84, and 91 to 94.

As mentioned earlier, the location of the read-out means along each strip 10,20,30,40 is chosen in accordance with the length (L) of the ambipolar drift path over which maximum integration of the radiation-generated minority carriers can be effected. The spacing between adjacent read-out means along each strip 10,20,30,40 may be at least as large as this distance L in order to reduce noise correlation between the output signals derived from the integrated radiation-generated minority-carrier density resulting from the same thermal image element when scanned past these adjacent read-out means. In these circumstances, a significant proportion of the minority carriers generated by the thermal image element in the length of, for example, the strip 40 up to the first read-out area 14 (having holes 14a and 14b) recombines before reaching the second read-out area 24 (having holes 24a and 24b), and similarly a significant proportion of such minority carriers generated between the read-out areas 14 and 24 recombines before reaching the third read-out area 34 (having holes 34a and 34b). Each of the strips 10,20,30,40 therefore behaves in a manner similar to a sequence of four detector elements (each element being similar to the discrete devices of GB-A 1,488,258) but with only two bias electrodes 1 to 4 and 41b to 44b.

The output circuit 129 comprises a time delay and integration (TDI) device which adds the signals from the sequential read-out means (14,24,34 and 44) but with an appropriate time delay to allow for the finite time taken to scan the thermal image element from one read-out area to the next in the sequence. Such a TDI device may be formed in, for example charge-coupled device (CCD) technology. Thus, in any one pass of the radiation image 110 over the length of a device strip 40 between its biasing electrodes 4 and 44b, there are four integrating stages (each over a length comparable with L) instead of only a single integrating stage (of length approaching L) as in the prior art devices of GB-A 1,488,258. This enables a considerable advantage to be achieved in terms of the signal-to-noise ratio.

The spacing between adjacent read-out means along each strip 10,20,30,40 may be less than the mean distance L over which the free radiation-generated minority carriers can pass in a lifetime and over which maximum integration can be effected. Such shorter spacing of the read-out means by used, for example, to reduce blurring of the image due to outward spread (diffusion) of a packet of radiation-generated free minority carriers as this packet drifts towards the next read-out means. In materials such as cadmium mercury telluride having its absorption edge in the 3 to 5 micrometers atmospheric window the minority carriers may have a longer lifetime and therefore a longer diffusion length so that the effects of such diffusive blurring may more readily occur.

By forming the read-out means 11 to 14, 21 to 24, 31 to 34, and 41 to 44 in accordance with the invention at such metallized holes which extend through the strips 10,20,30 and 40 to connect with the conductor pattern 71 to 74, 81 to 84, 91 to 94 and 61 to 64 of the substrate 100, a particularly compact connection structure and advantageous device characteristics can be obtained. The read-out means are orientated across the thickness of the strips 10,20,30 and 40 (and not across their upper major surface), the metallization 7 does not extend at least to any significant extent on the upper major surface of the strips 10,20,30 and 40, and the holes occupy typically less than one fifth of the total width of each strip 10,20,30 and 40. As a result, the read-out means and their connections do not interrupt the ambipolar drift path to any great extent, they can be located at particular positions across the width of the strips 10,20,30 and 40, and they need not significantly interface with the ambipolar drift of the minority carriers along the strips 10,20,30 and 40. The substrate conductor pattern (for example conductors 62,72,82 and 92) can carry the read-out connection from one strip (for example, strip 20) below an adjacent strip (for example, strip 10) so that these connections do not obscure the drift path of the adjacent strip (10), and a particularly compact parallel strip format can be obtained with the read-out means of the different strips 10,20,30 and 40 being aligned in a direction perpendicular to the direction of image scanning and the ambipolar drift paths, i.e. aligned read-out means 11 to 14; aligned read-out means 21 to 24; aligned read-out means 31 to 34; and aligned read-out means 41 to 44.

For the sake of clarity in the drawing, the parts of the substrate conductors 81 to 84 which extend below the strips 10,20,30 and 40 are not shown in FIG. 2. For the same reason, the parts of the strips 10,20,30 and 40 which extend over the substrate conductors 91 to 94 are not shown in FIG. 2, although the location of the associated read-out holes 31 to 34 is indicated in FIG. 2. The read-out conductor pattern 61 to 64, 71 to 74, 81 to 84, 91 to 94 as well as the biasing electrode connections 51 to 54 may be formed as metal tracks embedded in electrically insulating material at the upper major surface of the substrate 100, and where these metal tracks are contacted by the metallization 7 in the read-out holes and the biasing electrode metallization 1 to 4 and 41b to 44b they can be exposed at contract windows etched through a layer of insulating material between the substrate 100 and the strips 10,20,30,40. In this case, the whole substrate 100 may be of electrically insulating material. However by employing a semiconductor substrate 100 at least a part of at least some of the tracks forming the substrate conductor pattern may be formed by highly-doped semiconductor regions of one conductivity type diffused or implanted in a part of the substrate of the opposite conductivity type.

Figure 3:
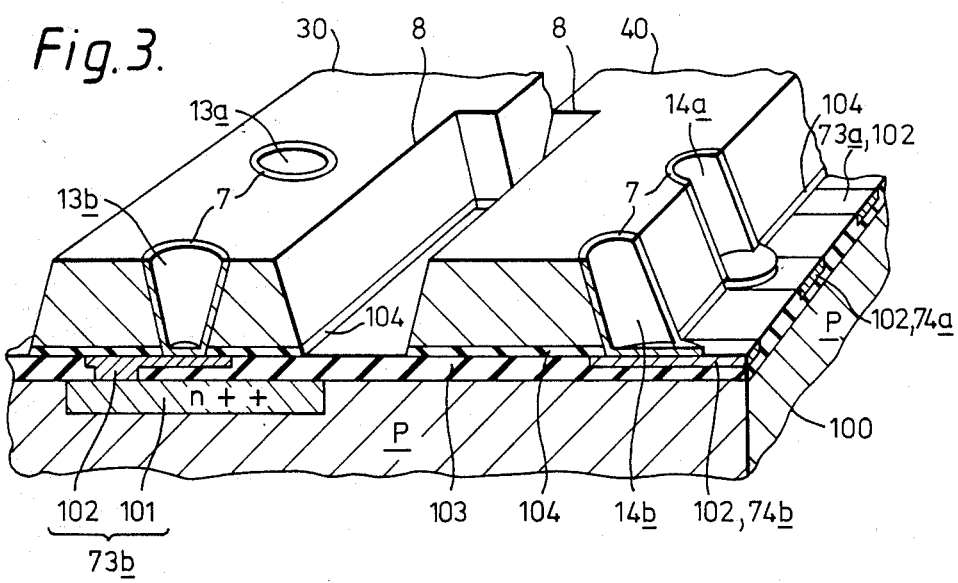
FIG. 3 is a partly perspective and partly cross-sectional view of a part of the device of FIG. 2, taken at an intermediate read-out area of two of the body portions of the device.
Figure 4:
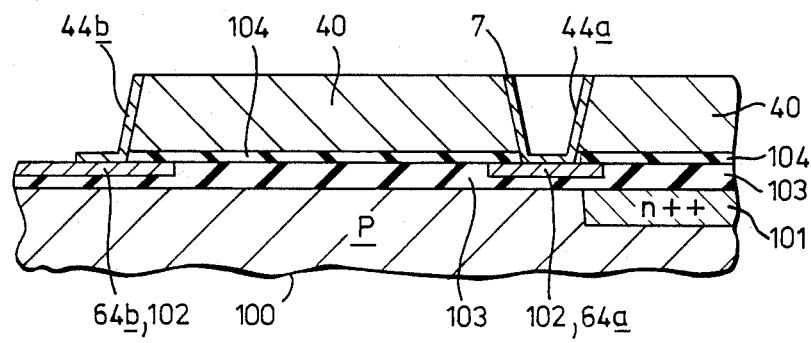
FIG. 4 is a cross-sectional view of another part of the device of FIG. 2, taken at an end read-out area of one of the body portions of the device and in a direction perpendicular to that of the cross-section of FIG. 3.

By way of example FIGS. 3 and 4 illustrate parts of the substrate conductor pattern 51 to 54, 61 to 64, 71 to 74, 81 to 84, and 91 to 94 formed by n-type semiconductor regions 101 and parts formed by metal tracks 102 in insulating material 103. The metal tracks 102 are accommodated in recesses in the insulating layer 103 to form a substantially flat upper major surface at least where the strips 10,20,30,40 are provided. The substrate 100 may be of silicon having thereon an insulating layer structure 103 of silicon dioxide. The output circuits 129 for each strip 10,20,30 and 40 may be formed in such a semiconductor substrate 100 (using for example known CCD technology) so that the substrate conductor pattern provides connections between different areas of the substrate 100. To minimise signal noise, each read-out conductive track preferably has approximately the same electrical resistance between its strip 10,20,30 or 40 and its output circuit 129, and this can be arranged by controlling the resistivity, width and thickness of the parts forming the conductor pattern.

The cadmium mercury telluride strips 10,20,30 and 40 may be secured to the substrate 100 by a thin layer of electrically-insulating epoxy adhesive 104 which may be for example at most 0.5 micrometer thick. On the lower and upper major surfaces of the strips 10,20,30 and 40 there is a thin passivating layer which may be of any known type, for example an anodic layer consisting mainly of oxides of mercury, cadmium and tellurium. For the sake of clarity in the drawings these upper and lower passivating layers are not shown in the cross-sectional views of FIGS. 3 and 4. The strips 10,20,30 and 40 are preferably formed on the substrate 100, by securing a passivated cadmium mercury telluride body of the desired thickness to the substrate 100 with the adhesive layer 104, providing a masking layer pattern consisting of strip-shaped areas of photoresist on the upper surface of the body, and then ion-etching slots through the thickness of the body to form the separate strip-shaped portions 10,20,30 and 40. Recesses 8 present in the periphery of the body portions 30 and 40 can be formed in the same ion-etching step by providing the appropriate shape in the masking layer pattern. The positioning of the body and masking layer pattern on the substrate 100 is such that the resulting strips 10,20,30 and 40 are orientated in the desired manner with respect to the conductor pattern of the substrate 100.

Figure 6:
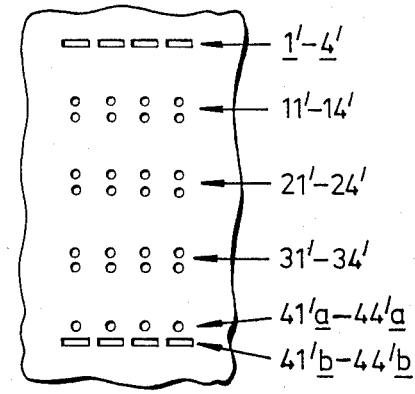
FIG. 6 is a plan view of a masking layer which may be used for ion-etching and metallization steps in the manufacture of such devices in accordance with the invention.

After removing this first masking layer pattern a further masking layer pattern is provided on the strips 10,20,30,40 and the surrounding area of the substrate 100 to define the read-out holes and their metallization 7. This further masking layer may also define the electrode metallization 1 to 4 and 41b to 44b for the bias electrodes at the ends of each strip 10,20,30,40. An example of the geometry of this masking layer (which may again be of photoresist) is illustrated in FIG. 6 for the FIG. 2 device layout. The following windows are present in this masking layer: two rows of slot-shaped windows 1' to 4', and 41b' to 44b' where the biasing electrodes are to be formed at the opposite ends of the strips 10,20,30 and 40; a row of circular windows 41a' to 44a' where the final read-out area is provided at one end of each strip 10,20,30 and 40; and three rows of paired circular windows 11' to 14', 21' to 24' and 31' to 34' where the intermediate read-out areas are to be provided along the strips 10,20,30 and 40.

The strips 10,20,30 and 40 are then subjected to a further ion-etching step through the thickness of the cadmium mercury telluride (and its passivating layers) at these windows to form the read-out holes and the end-contact faces for the biasing electrodes. The adhesive layer 104 is also removed at these windows to expose the substrate conductor pattern where it is to be contacted. Metallization, for example a layer of gold of suitable thickness is then deposited on this further masking layer pattern and in its windows, after which this further masking layer is removed to lift away the overlying metallization while leaving the metallization in the read-out holes to form the electrical connections 7 from the side-wall of each of these holes to the read-out conductors 71 to 74, 81 to 84, 91 to 94 and 61a to 64a of the substrate 100. Similarly the metallization is left at the end faces of the strips 10,20,30 and 40 to form the biasing electrodes 1 to 4 and 41b to 44b connected to the biasing conductors 51 to 54 and 61b to 64b of the substrate 100. The formation of the read-out holes in the cadmium mercury telluride strips by ion-etching produces steep side-walls for these holes with at most only small lateral etching occurring below the edge of the photoresist masking pattern. A typical slope for these steep side-walls is for example 75° so that precisely-located, narrow read-out holes can be formed through the thickness of the strips 10,20,30 and 40 in this manner. Furthermore by using the same masking layer and a lift-off step to define the metallization 7 the whole surface of these steep side-walls can be contacted in a reliable manner without the metallization extending onto the upper major surface of the strips 10,20,30 and 40. The use of ion-etching and lift-off metallization for conventional infra-red photoconductor detectors which do not include read-out means in an ambipolar drift path is already described in our published European patent application EP-A 0007667 (Our reference: PHB 32631) to which reference is invited.

Usually, all the strips 10,20,30 and 40 of the same device will have the same read-out hole configuration. However in order to illustate various possible modifications without unnecessarily multiplying the number of drawings, FIG. 2 illustrates different read-out hole configuration across the width of the different strips 10,20,30 and 40. Thus, the read-out holes 11a and b, 21a and b, 31a and b and 41a are located at areas along the periphery of the strip 10 which is otherwise of uniform width throughout its length. The read-out holes 12a and b, 22a and b, 32a and b and 42a are located at areas spaced from the periphery of the strip 20 and may be for example half-way across the width of the strip 20 which is also uniform throughout its length. The strips 30 and 40 are similar to the strips 20 and 10 respectively, except that recesses 8 are present in the periphery of the strips 30 and 40 to narrow the drift path at the read-out areas. All these different read-out holes configurations provide acceptable device characteristics.

Figure 5:
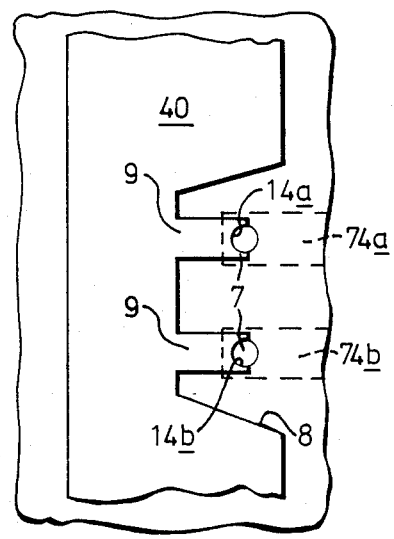
FIG. 5 is a plan view of a modified read-out area of such a device in accordance with the invention.

FIG. 5 illustrates a particularly advantageous combination of a narrow ambipolar drift path with metallized read-out holes in accordance with the invention. Although only one read-out area is illustrated in FIG. 5, a plurality of such read-out areas is provided in the ambipolar drift path of a device in accordance with the invention, for example at the areas 14,24 and 34 of the strip 40 of FIG. 2. In the configuration of FIG. 5 the increased drift velocity and increased responsivity are obtained due to the narrowing of the path by the recess 8, while disturbance of the drift path and optical obscuration is reduced by providing the metallization read-out holes at the ends of strip-shaped parts 9 of the cadmium mercury telluride body portion (40), which strip-shaped parts 9 extend from the ambipolar drift path into the recess 8.

In this case, the strip-shaped parts 9 of cadmium mercury telluride form part of the read-out electrodes; because of their higher resistivity than the metallization 7, these parts 9 introduce a higher series resistance into the read-out electrode connection to the ambipolar drift path. In this case, the metallized holes (14a, 14b etc.) may be located in line with the main periphery of the strip (40) so that the parts 9 are approximately as long as the recess 8 is deep. However in order to reduce the series resistance these parts 9 may be shorter, particularly where the recess 8 is very deep, for example over about a half or more of the width of the strip (40).

It will be evident that many modifications are possible within the scope of the present invention. Thus, for example, the first read-out hole a of each pair 11,21,31,41 and 12,22,32,42 along the strips 10 and 20 may be located at or nearer to one side-periphery (e.g. the left-hand side) of the strip whereas the second read-out hole b of that pair may be located at or nearer to the opposite side-periphery (e.g. the right-hand side) of that strip.

As already mentioned the composition of the n-type cadmium mercury telluride may be chosen differently, for example to provide a device for imaging radiation in the 3 to 5 micrometer atmospheric window. Semiconductor materials other than cadmium mercury telluride may be used to form the photoconductive strips 10,20,30,40. In addition to or instead of spacing successive read-out areas by a distance less than the length L over which the radiation-generated minority carriers can drift in a lifetime, the ambipolar drift path can be meandered by incorporating interdigital transverse slots in the strips 10,20,30 and 40 over the length before the read-out areas in order to restrict the diffusive spread of the drifting carriers before they reach the read-out areas. Individual meandering strips which have only single conventional read-out means are described in the published British Patent Application GB 2019649A to which reference is invited.

The use of ion-etching to fabricate the strips 10,20,30 and 40 from a common body produces exposed peripheral walls of the strips. Although these peripheral walls are not shown as passivated in FIGS. 3 and 4, a passivating layer can be provided in known manner on these exposed peripheral walls of the cadmium mercury telluride. Especially with narrow drift paths, such peripheral passivation can be beneficial in decreasing carrier recombination effects at these peripheral walls.

In the FIG. 2 embodiment the metal layer which forms the second electrode of the final read-out pair 41,42,43,44 of each strip 10,20,30,40 also forms the biasing electrode 41b,42b,43b,44b at that end of the strip 10,20,30,40. However it is also possible for the second electrode of the final read-out pair to be a metallized hole which is like the other read-out holes and which is separate from the biasing electrode. It is also possible for this end biasing electrode 41b,42b,43b,44b towards which the minority carriers drift to be common to all the strips 10,20,30 and 40, and the strips 10,20,30 and 40 may even be integrally united via a common cadmium mercury telluride portion which may support this common biasing electrode.

Only one end of each strip 10,20,30 and 40 of the device as illustrated in FIG. 2 has a read-out area. However read-out areas may be present at both ends of the strips 10,20,30 and 40, even when the end biasing electrodes form part of the final read-out electrode pairs. This double-ended read-out facility permits read-out with the strips 10,20,30,40 biased in either direction i.e. either towards biasing electrodes 41b to 44b or towards biasing electrodes 1 to 4. Therefore if the characteristics of the device as made are better when biased in one direction rather than the other, this one direction can be chosen for operation.

Although as described previously, the bias electrode metallization can be formed in the same deposition and lift-off steps as are used to provide the metallization 7 in the read-out holes, the bias electrodes 1 to 4 and 41b to 44b can be formed in separate processing steps from the metallization 7.

The read-out means of the cadmium mercury telluride strips may be of any other known type, instead of comprising a pair of electrodes formed by a pair of metallized holes. Thus, each of the read-out means 11 to 14, 21 to 24, 31 to 34, and 41 to 44 may comprise a single larger metallized-hole, in which the metallization (7) forms a Schottky (metal-semiconductor) diode junction with the n-type material of the strip 10,20,30,40. Furthermore instead of having a Schottky diode junction, each of the read-out means 11 to 14, 21 to 24, 31 to 34, and 41 to 44 may comprise a single metallized hole and a wider p-type region which forms a p-n junction diode with the bulk n-type material of the strip 10,20,30,40; in this case, the metallization (7) provides an ohmic connection to the p-type diode region over the whole side-wall of the hole. These diode junctions extend through the thickness of the strips. The biasing electrode 41b to 44b provides an ohmic connection to the common n-type material, and the positioning of the diode junctions with respect to this electrode 41b to 44b is not critical provided the impedance of the intermediate n-type part is less than the impedance of the diode junctions.

Especially when diode junctions are formed at the metallized read-out holes, the read-out holes may be located transverse to the drift path in a wider body portion, instead of or as well as being located sequentially along the drift path.

Although the present invention is particularly advantageous and important for imaging devices having multiple read-out means in the (or each) ambipolar drift path, similar metallized hole connections may be used for imaging devices having only a single read-out means in the (or each) drift path, for example at one end of the path.

What I claim is:

1. In a thermal-radiation imaging system comprising a thermal-radiation detector device having an ambipolar drift path for free charge-carriers which are generated by the thermal radiation, and scanning means for scanning a thermal-radiation image along said drift path in the same direction as the ambipolar drift and at a rate corresponding substantially to the ambipolar drift velocity, the device comprising:
    at least one semiconductor body portion of elongated shape having a length which provides the ambipolar drift path and having a thickness which is smaller than its width, the body portion being of semiconductor material of one conductivity type in which free charge carriers are generated along the drift path on absorption of the thermal radiation;
    biasing electrode means spaced on the body portion for causing a bias current predominantly of majority charge carriers to flow along the length of the elongate body portion in one direction, said bias current being capable of supporting an ambipolar drift of radiation-generated minority charge carriers in the opposite direction to said flow of majority carriers;
    read-out means at at least one area in the ambipolar drift path for providing a signal representative of the ambipolar drift at that area as sampled across the thickness of the body portion, said read-out means comprising metallization which extends through the thickness of the body portion at at least one hole located on the periphery of the body portion, said metallization being confined to substantially the whole side-wall of the hole without extending on the upper major surface of the semiconductor body portion or on the periphery of the body portion outside the side-wall of the hole; and
    a support on which said at least one semiconductor body portion is present, said substrate having a conductor pattern which extends below said at least one hole in the ambipolar drift path and to which said metallization forms an electrical connection for the read-out means.

2. A device as claimed in claim 1, wherein at least one said read-out means comprises a pair of said holes which are spaced along the ambipolar drift path, and at the side-walls of said holes the metallization forms an electrode connection to the body portion of said one conductivity type.

3. A device as claimed in claim 1, wherein at the area of said read-out means the drift path is narrowed by a recess in the periphery of the body portion.

4. A device as claimed in claim 3, wherein at least one said hole of the read-out means is present at the end of a strip-shaped part of said body portion, which part extends into said recess from the ambipolar drift path.

5. A device as claimed in claim 1, wherein the largest transverse dimension of said at least one hole of the read-out means is less than a third of the width of the ambipolar drift path before the area of the read-out means.

6. A device as claimed in claim 1, wherein a substantially parallel plurality of said semiconductor body portions each having an ambipolar drift path is present on the substrate, and in that a plurality of read-out means each comprising at least one said hole is present in each of said ambipolar drift paths.

7. A device as claimed in claim 6, wherein the read-out means of the different body portions are substantially aligned in a direction substantially perpendicular to the ambipolar drift paths.

8. In a thermal-radiation imaging system comprising a thermal-radiation detector device having an ambipolar drift path for free charge-carriers which are generated by the thermal radiation, and scanning means for scanning a thermal-radiation image along said drift path in the same direction as the ambipolar drift and at a rate corresponding substantially to the ambipolar drift velocity, the device comprising:
    at least one semiconductor body portion of elongated shape having a length which provides the ambipolar drift path and having a thickness which is smaller than its width, the body portion being of semiconductor material of one conductivity type in which free charge carriers are generated along the drift path on absorption of the thermal radiation;
    biasing electrode means spaced on the body portion for causing a bias current predominantly of majority charge carriers to flow along the length of the elongated body portion in one direction, said bias current being capable of supporting in said body portion an ambipolar drift of radiation-generated minority charge carriers in the opposite direction to said flow of majority carriers;
    read-out means at at least one area in the ambipolar drift path for providing a signal representative of the ambipolar drift at that area as sampled across the thickness of the body portion, said read-out means comprising metallization which extends through the thickness of the body portion at at least one hole in the ambipolar drift path at that area, which hole locally narrows the width of the ambipolar drift path, said metallization extending over substantially the whole side-wall of the hole without extending on the upper major surface of the semiconductor body portion, the largest transverse dimension of said at least one hole in the ambipolar drift path being less than a third of the width of the ambipolar drift path before the area of the read-out means; and
    a substrate on which said at least one semiconductor body portion is present, said substrate having a conductor pattern which extends below said at least one hole in the ambipolar drift path and to which said metallization forms an electrical connection for the read-out means.

9. A device as claimed in claim 8, wherein at least one said hole of the read-out means extends through the drift path at a location spaced from the periphery of the body portion.

10. A device as claimed in claim 8, wherein at least one said hole of the read-out means extends through the thickness of the body portion at a location on the periphery of the body portion.

11. A device as claimed in claim 8, wherein a plurality of said read-out means is present in the ambipolar drift path at different locations between the spaced biasing electrode means, each of said read-out means having at least one said hole in the body portion.

12. A device as claimed in claim 11, wherein a plurality of said read-out means each having at least one said hole is provided sequentially along the ambipolar drift path between the spaced biasing electrode means.

13. A device as claimed in claim 12, wherein the spacing between the sequentially-provided read-out means along the ambipolar drift path is at least as large as the mean distance over which the radiation-generated free minority charge carriers can pass in a lifetime in the semiconductor body portion.

14. A device as claimed in claim 12, wherein the spacing between the sequentially-provided read-out means along the ambipolar drift path is less than the mean distance over which the radiation-generated free minority charge carriers can pass in a lifetime in the semiconductor body portion.

15. A device as claimed in claim 8, wherein the substrate comprises an output signal processing circuit which is connected to the read-out means via the conductor pattern.

16. A device as claimed in claim 8, wherein the semiconductor body portion is of n-type cadmium mercury telluride.

17. A device as claimed in claim 8, wherein at least one of said read-out means comprises a pair of said holes which are spaced along the ambipolar drift path, and at the side-walls of said holes the metallization forms an electrode connection to the body portion of said one conductor type.

18. A device as claimed in claim 17, wherein, in addition to the local narrowing of the ambipolar drift path by each hole, the width of the ambipolar drift path between the pair of holes is narrowed by a recess in the periphery of the body portion at the area of the read-out means.

19. In a thermal-radiation imaging system comprising a thermal-radiation detector device having parallel ambipolar drift paths for free charge-carriers which are generated by the thermal radiation, and scanning means for scanning a thermal-radiation image along said parallel drift paths in the same direction as the ambipolar drift and at a rate corresponding substantially to the ambipolar drift velocity, the device comprising:

a substrate having a conductor pattern;

a substantially parallel plurality of elongated semiconductor body portions present side-by-side on the substrate and extending over part of the conductor pattern of the substrate, each elongated body portion having a length which provides one of the ambipolar drift paths and having a thickness which is smaller than its width, each body portion being of semiconductor material of one conductivity type in which free charge carriers are generated along the drift path on absorption of the thermal radiation;

biasing electrode means spaced on each body portion for causing a bias current predominantly of majority charge carriers to flow along the length of each elongate body portion in one direction, said bias current being capable of supporting in each body portion an ambipolar drift of radiation-generated minority charge carriers in the opposite direction to said flow of majority carriers;

read-out means at a plurality of areas in each of the ambipolar drift paths for providing a signal representative of the ambipolar drift at that area as sampled across the thickness of the body portion, said read-out means comprising metallization which extends through the thickness of the body portion at at least one hole in the ambipolar drift path at that area, which hole locally narrows the width of the ambipolar drift path, said metallization extending over substantially the whole side-wall of the hole without extending on the upper major surface of the semiconductor body portion, the largest transverse dimension of each of said holes in the ambipolar drift path being less than a third of the width of the ambipolar drift path before the area of the read-out means, said metallization at each hole providing an electrical connection for said read-out means to the conductor pattern of the substrate.

20. An imaging device as claimed in claim 19, wherein at least one said read-out means of each of the body portions comprises a pair of said holes which are spaced along the ambipolar drift path of that body portion and at the side-walls of said holes, the metallization forms an electrode connection to the body portion of said one conductivity type.

* * * * *

UNITED STATES PATENT AND TRADEMARK OFFICE
CERTIFICATE OF CORRECTION

Page 1 of 2

PATENT NO. : 4,859,851

DATED : August 22, 1989

INVENTOR(S) : John T.M. WOTHERSPOON

It is certified that error appears in the above-identified patent and that said Letters Patent is hereby corrected as shown below: Title page:

IN THE ABSTRACT:

Line 2, change "semconductor" to --semiconductor--;

line 4, change "4b" to --41b--.

IN THE SPECIFICATION:

Column 1, line 16, change "change carries" to --charge carriers--;

line 19, change "carries" to --carriers--;

line 52, change "device" to --devices--.

Column 2, line 65, change "carries" to --carriers--.

Column 3, line 28, change "structure" to --structures--.

Column 4, line 21, after "path" change "of" to --at--.

Column 7, line 33, change "those" to --these--;

line 62, change "drawings" to --drawing--.

Column 8, line 46, change "by" to --may be--.

UNITED STATES PATENT AND TRADEMARK OFFICE
CERTIFICATE OF CORRECTION

PATENT NO. : 4,859,851

DATED : August 22, 1989

INVENTOR(S) : John T.M. WOTHERSPOON

It is certified that error appears in the above-identified patent and that said Letters Patent is hereby corrected as shown below:

Column 9, line 6, change "face" to --fere--;

line 34, change "contract" to --contact--.

Column 11, line 16, change "figuration" to --figurations--.

Signed and Sealed this

Thirtieth Day of October, 1990

Attest:

HARRY F. MANBECK, JR.

*Attesting Officer*  *Commissioner of Patents and Trademarks*